(12) United States Patent
Huff

(10) Patent No.: US 9,646,878 B2
(45) Date of Patent: May 9, 2017

(54) METHOD FOR FABRICATING AND MANUFACTURING MICRO—AND NANO-FABRICATED DEVICES AND SYSTEMS SECURELY

(71) Applicant: Corporation for National Research Initiatives, Reston, VA (US)

(72) Inventor: Michael A. Huff, Oakton, VA (US)

(73) Assignee: CORPORATION FOR NATIONAL RESEARCH INITIATIVES, Reston, VA (US)

( * ) Notice: Subject to any disclaimer, the term of this patent is extended or adjusted under 35 U.S.C. 154(b) by 79 days.

(21) Appl. No.: 14/309,236

(22) Filed: Jun. 19, 2014

(65) Prior Publication Data

US 2015/0371890 A1    Dec. 24, 2015

(51) Int. Cl.
     *G06F 17/50*      (2006.01)
     *H01L 21/768*      (2006.01)
     *B81C 99/00*      (2010.01)
     *H01L 21/8238*      (2006.01)

(52) U.S. Cl.
     CPC .... *H01L 21/76838* (2013.01); *B81C 99/0055* (2013.01); *H01L 21/823892* (2013.01)

(58) Field of Classification Search
     CPC ............. G06F 17/5068; G06F 17/5045; G06F 17/5081
     USPC ....................................................... 716/139
     See application file for complete search history.

(56) References Cited

U.S. PATENT DOCUMENTS

| | | | |
|---|---|---|---|
| 2002/0035502 A1* | 3/2002 | Raza | G06Q 10/06311 705/7.14 |
| 2008/0209382 A1* | 8/2008 | Dunham | G03F 7/70466 716/119 |
| 2009/0100392 A1* | 4/2009 | Ivaldi | G03F 7/70541 716/106 |
| 2011/0087705 A1* | 4/2011 | Swink | H04L 51/32 707/800 |
| 2011/0250706 A1* | 10/2011 | Huff | B81C 99/006 438/5 |
| 2013/0049215 A1* | 2/2013 | Larsen | H01L 23/485 257/774 |

* cited by examiner

*Primary Examiner* — Vuthe Siek
(74) *Attorney, Agent, or Firm* — Nixon & Vanderhye P.C.

(57) ABSTRACT

A method is disclosed for manufacturing integrated circuits, microelectronics, micro-electro-mechanical systems (MEMS), nano-electro-mechanical systems (NEMS), photonic, and any micro- and nano-fabricated devices and systems designs that allow these designs to be kept secure. The manufacturing of the devices in the substrates is performed in a traditional manner at a foundry that can be located anywhere in the world., The manufacturing at this foundry is stopped just before the fabrication of the first layer of electrical interconnects. At this stage, the semiconductor substrates with the devices, minus electrical interconnects, are sent back to the design organization (or their designated trusted foundry) to perform the fabrication of the electrical interconnects to complete the entire manufacturing process. Since the electrical interconnection wiring diagram is the critical component of the design, this de-coupling of the manufacturing allows the designs of the devices and systems to be kept secure and confidential.

16 Claims, 12 Drawing Sheets

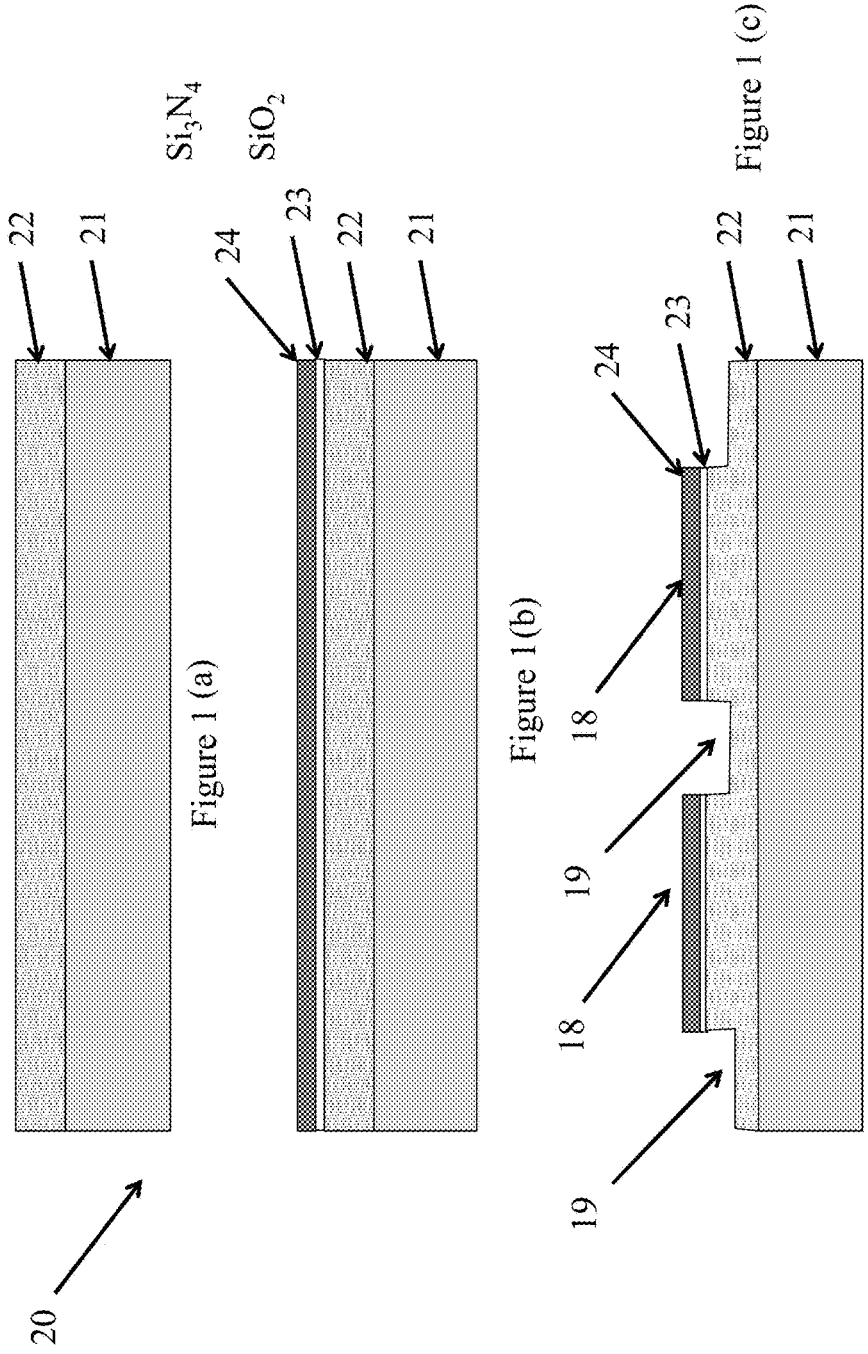

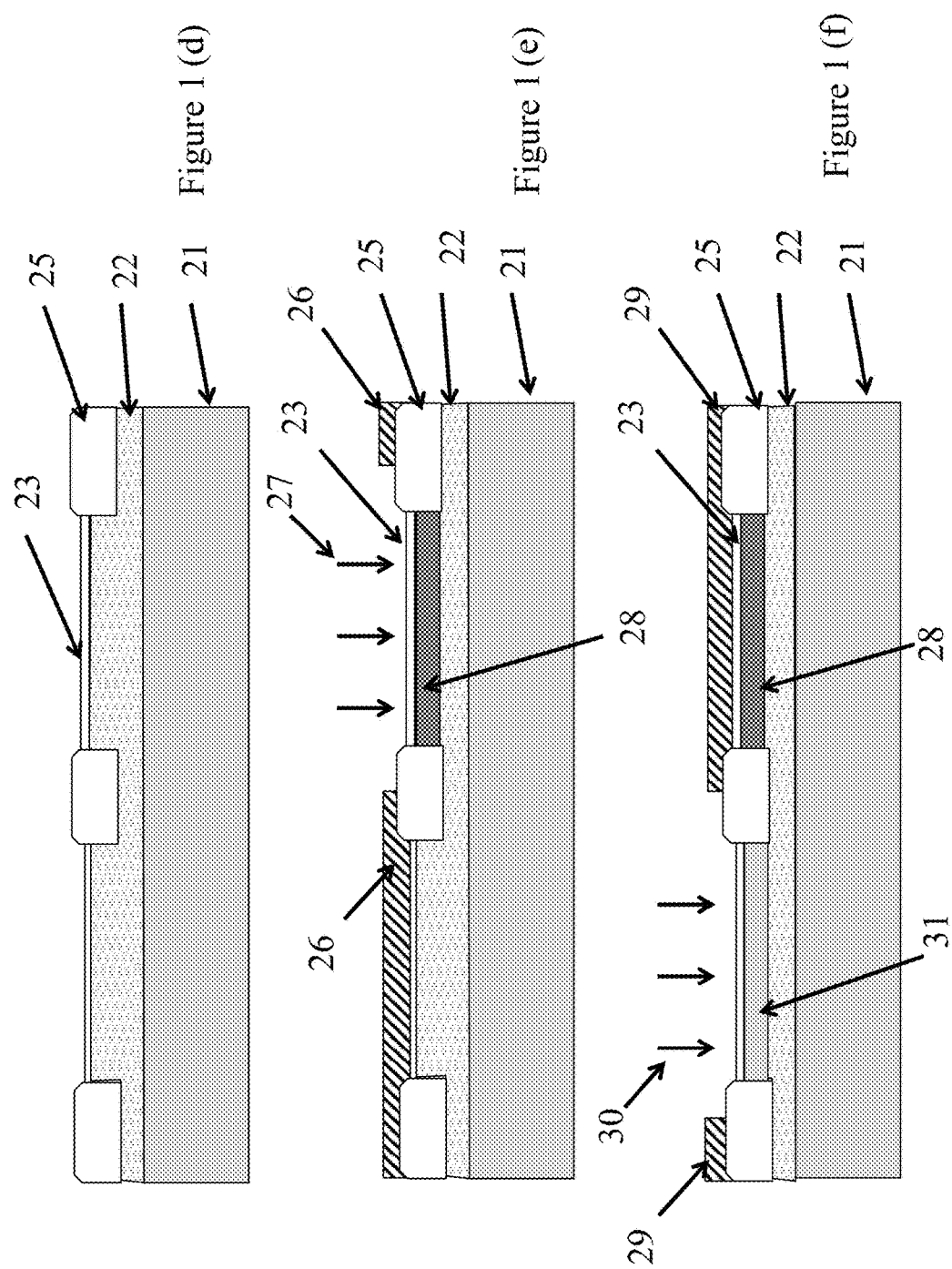

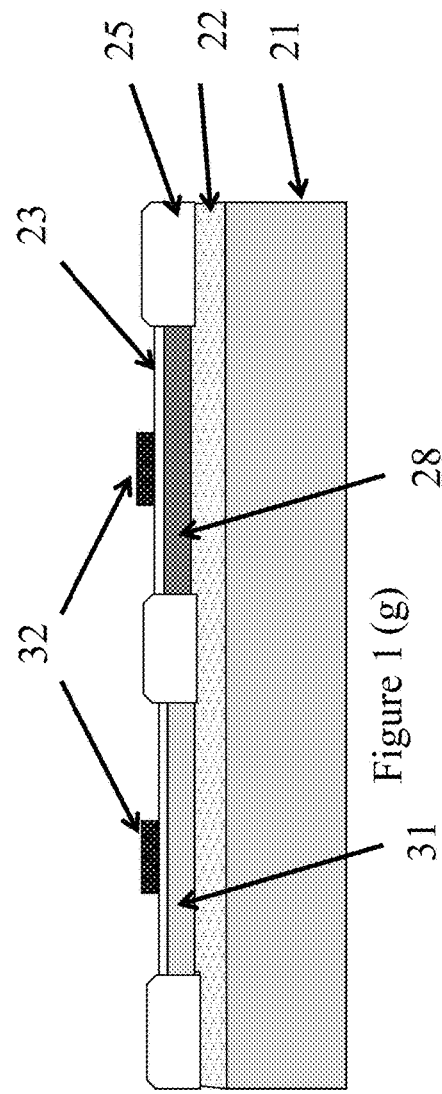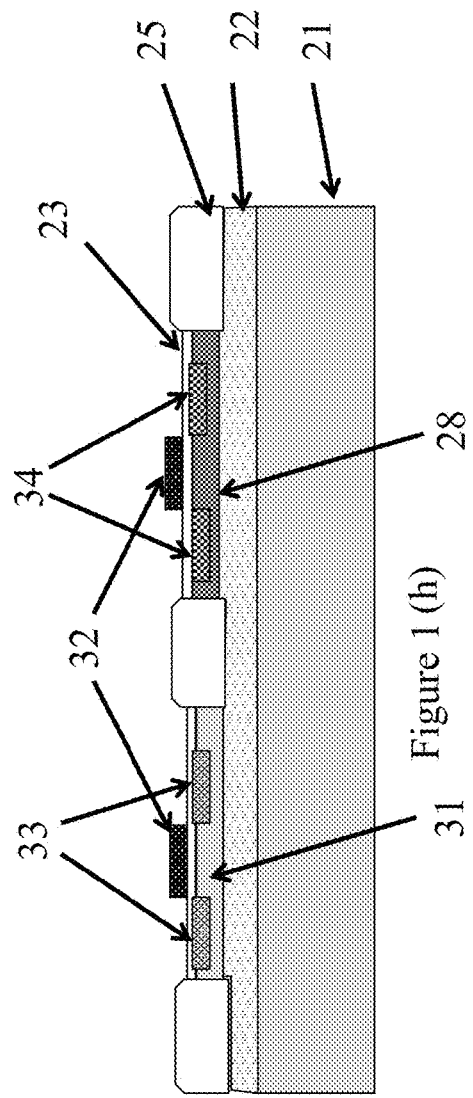

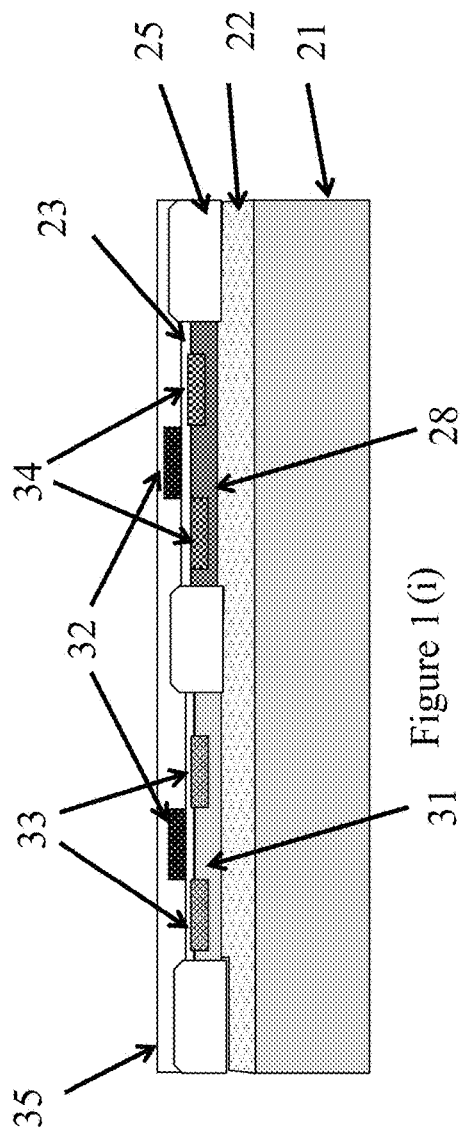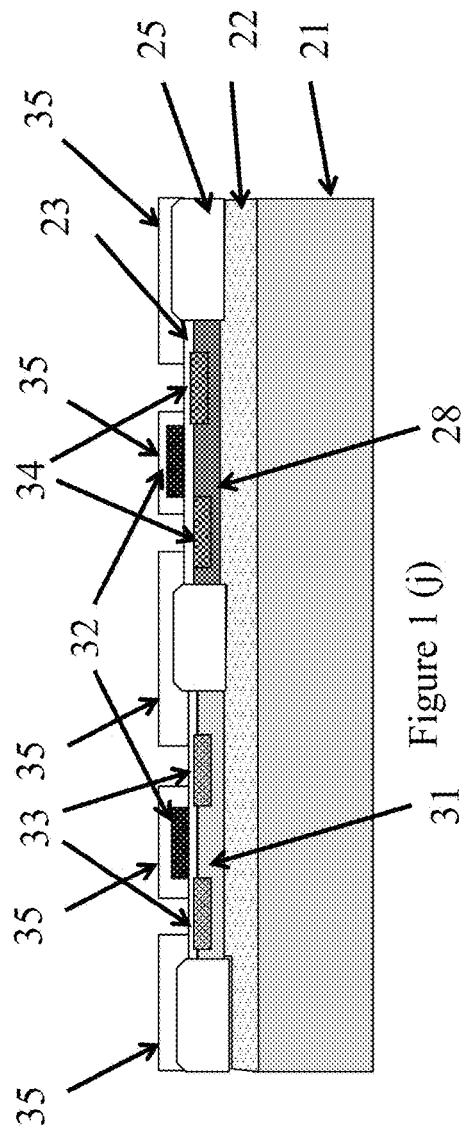

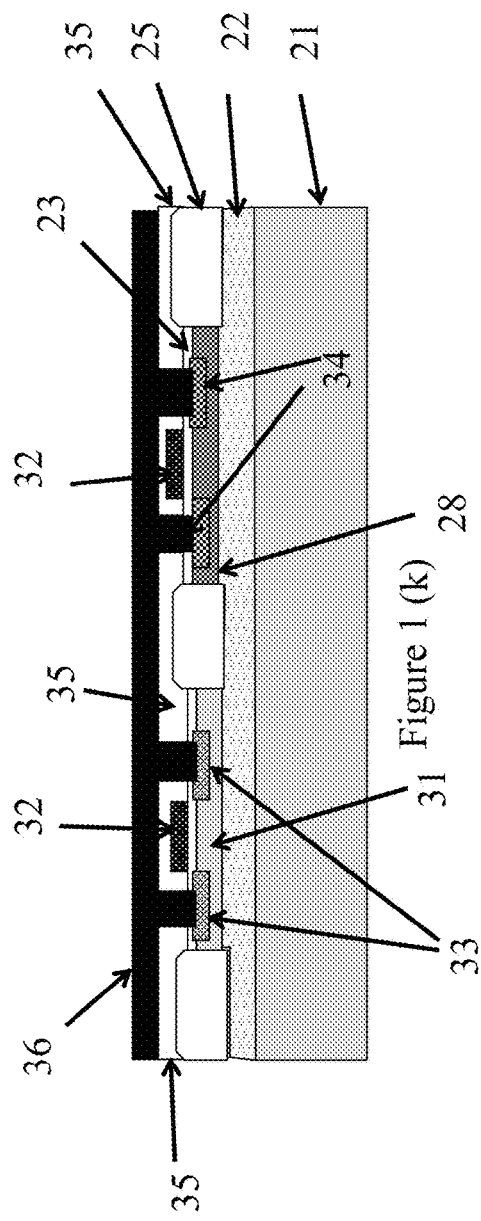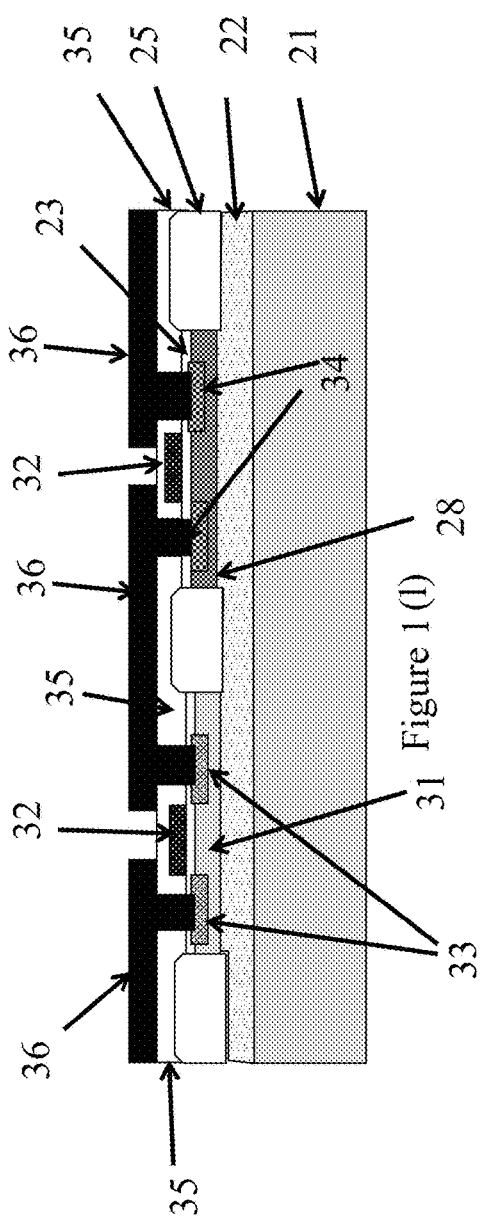

METHOD FOR FABRICATING AND MANUFACTURING MICRO—AND NANO-FABRICATED DEVICES AND SYSTEMS SECURELY

FIELD OF INVENTION

The present invention is directed to a method for the fabrication of integrated circuit, microelectronic, micro-electro-mechanical systems (MEMS), nano-electro-mechanical systems (NEMS), photonic, and any micro- and nano-fabricated device and systems designs that can be kept secure.

BACKGROUND OF THE INVENTION

Integrated circuits, microelectronics, micro-electro-mechanical systems (MEMS), nano-electro-mechanical systems (NEMS), photonics, and any micro- and nano-fabricated devices and systems are fabricated using micro- and nano-fabrication methods. Many times these devices and systems are designed by an organization or company who then sends their designs to another organization or company that operates the foundry that manufactures the devices and systems. Often the manufacturing organizations are located in different countries around the world that are not in the same country as the organization that produced and owns the design of the microelectronics. Obviously the organizations that sends their designs to the manufacturing organization must place a great amount of trust in the manufacturing organization since the designs often consist of proprietary and confidential design information that represent very valuable intellectual property of the organization that produced the designs. Moreover, in some circumstances the designs may also contain information that is controlled by export regulations. Unfortunately, the tremendous complexity of today's microelectronics and other micro- and nano-fabricated devices and systems makes knowing if a design has been misused extremely difficult to detect or police. The present invention describes a method for the manufacturing of integrated circuits, microelectronics, micro-electro-mechanical systems (MEMS), nano-electro-mechanical systems (NEMS), photonics, and any micro- and nano-fabricated devices and systems fabricated using micro- and nano-fabrication methods that can be sent to another organization or company for manufacturing while still maintaining confidentiality of the design.

SUMMARY OF INVENTION

The present invention is directed to a method for the manufacture of integrated circuits, microelectronics, micro-electro-mechanical systems (MEMS), nano-electro-mechanical systems (NEMS), photonic, and any micro- and nano-fabricated device and systems designs that allows the designs of these devices and systems to be kept secure. The core of this method is to have the manufacturing of the devices in the substrates performed in the traditional manner at a foundry operation that can be located anywhere in the world, but stopping the manufacturing process at this foundry just before the fabrication of the first layer of electrical interconnects is performed. At this stage, the semiconductor substrates with the devices, minus electrical interconnects, are sent back to the design organization (or their designated trusted foundry) who then performs the process to fabricate the electrical interconnects to complete the entire manufacturing process. Since the electrical interconnection wiring diagram is the critical component of the design, this de-coupling of the manufacturing allows the designs of the devices and systems to be kept secure and confidential. This method is suitable for any micro- or nano-fabricated device or system.

BRIEF DESCRIPTION OF THE DRAWINGS

FIGS. 1a to 1m are a series of cross sections of substrates that are undergoing the manufacturing steps for making dual-well CMOS microelectronics.

DETAILED DESCRIPTION OF THE INVENTION

Figure 1M:
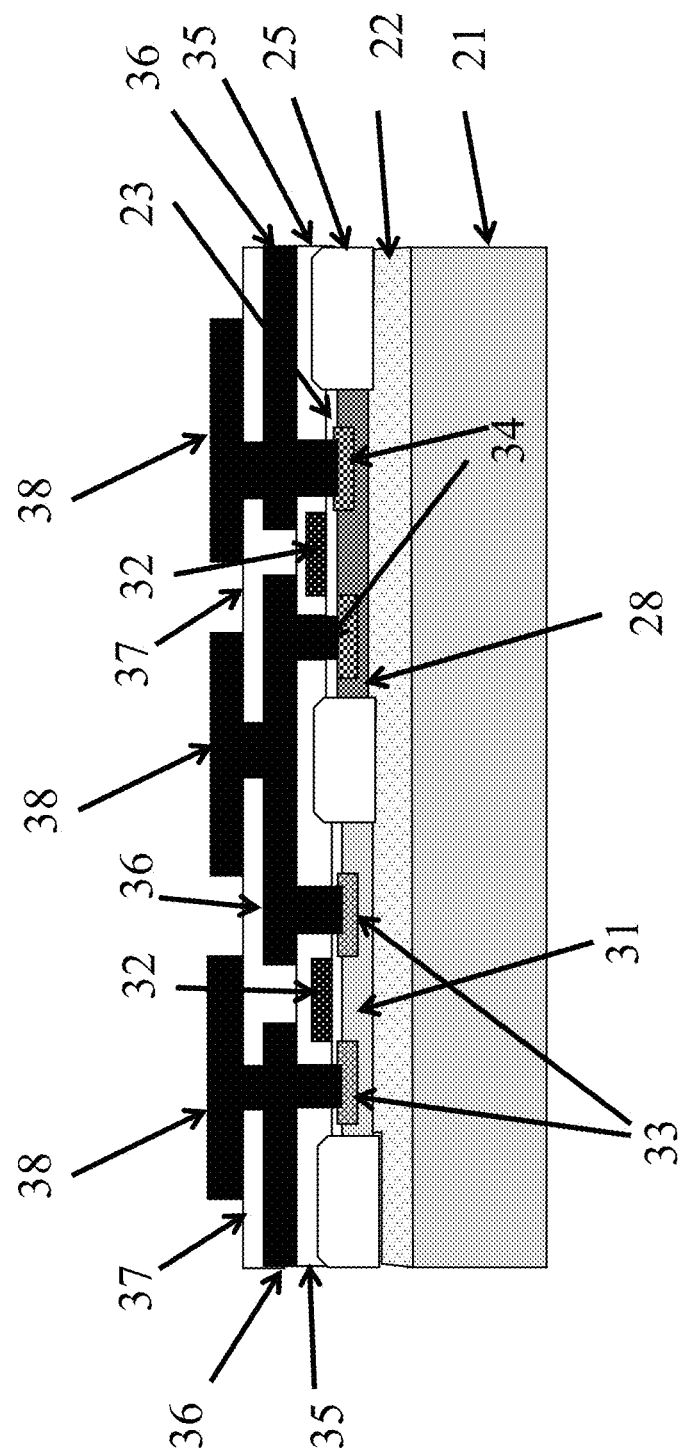

Integrated circuits, microelectronics, micro-electro-mechanical systems (MEMS), nano-electro-mechanical systems (NEMS), photonics, and any micro- and nano-fabricated devices and systems are fabricated using micro- and nano-fabrication methods. Many times these devices and systems are designed by an organization or company who then sends their designs to another organization or company that operates the foundry that produces the microelectronics. This manufacturing model has become the normal circumstance in the semiconductor industry where design organizations develop designs of semiconductor devices and send their proprietary and confidential designs to foundries that are owned and operated by other organizations who perform the manufacturing of the devices and systems according to the designs submitted by the design organization. This "outsourcing" of the manufacturing of semiconductors is now a very common practice in the industry and is driven by the enormous cost of the manufacturing facilities employed in the semiconductor industry.

Often the manufacturing foundries are located in different countries around the world that are not in the same country as the organizations that produce and own the designs. Consequently the organization that sends their designs to a manufacturing foundry must place a great amount of trust in the manufacturing foundry since the designs often consist of proprietary and/or confidential designs that represent very valuable intellectual property of the design organization. Moreover, in some circumstances the designs may also contain information that is controlled by export regulations that precludes sending the designs out of the country without getting Governmental approval as well as taking numerous burdensome precautions. In still other circumstances the designs may also contain information that is covered under various laws that make "off shore" manufacturing even more problematic.

Unfortunately, the tremendous complexity of these devices and systems makes knowing if a design has been misused extremely difficult to detect or police. Additionally, the complexity of these technologies also makes it very difficult to determine if something nefarious has been done to the devices and/or systems during manufacturing that could cause the device and/or systems to malfunction at some time in the future. This concern has arisen in recent years based on reported examples of systems being completely disabled at the most inappropriate time. The technology community has created a name for this phenomenon, which is termed a "hardware Trojan," based on the concept of the Trojan horse from Greek mythology.

The present invention describes a method for the manufacturing of integrated circuits, microelectronics, micro-electro-mechanical systems (MEMS), nano-electro-mechanical systems (NEMS), photonics, and any micro- and nano-fabricated devices and systems that are fabricated using micro- and nano-fabrication methods that can be sent to another party for manufacturing and still maintain confidentiality and security of the designs.

The core of this method is to have the manufacturing of the devices in the semiconductor substrates performed in the traditional manner at another organization's foundry operation that can be located anywhere in the world, but stopping the manufacturing process at this foundry just before the fabrication of the first layer of electrical interconnects is performed. At this stage, the semiconductor substrates with the devices and systems partially manufactured, that is the semiconductor substrates minus the electrical interconnects, are sent back to the design organization (or their designated trusted manufacturing partner) who then performs the processes to fabricate the electrical interconnects to complete the entire manufacturing process. Since the electrical interconnection wiring diagram is the critical component of the design, this de-coupling of the manufacturing allows the designs of the devices and systems to be kept completely secure and confidential. This method is suitable for any micro- or nano-fabricated device or system.

The method of the present invention has application in the fabrication of electronics, passive electronic devices, microelectronics, power electronics, Monolithic Microwave Integrated Circuits (MMICs), high-voltage electronics, high-temperature electronics, high-power electronics, Light-Emitting Diodes (LEDs), Micro-Electro-Mechanical Systems (MEMS), micro-mechanical devices, microelectronic devices and systems, nanotechnology devices and systems, Nano-Electro-Mechanical Systems (NEMS), photonic devices, and any devices and/or structures made from any substrate including any semiconductor material type.

FIGS. 1a to 1m illustrate the manufacturing of a type of integrated circuit, specifically complementary-metal-oxide-semiconductor (CMOS) microelectronics. Specifically, FIGS. 1a to 1m illustrate a generic and simplified process flow for the manufacturing for NMOS (N-type metal oxide semiconductor) and PMOS (P-type metal oxide semiconductor) type of MOSFET (metal oxide semiconductor field effect transistor) transistors in a dual-well CMOS (complementary metal oxide semiconductor) process flow.

The manufacturing process flow 20 begins in FIG. 1a which is the silicon semiconductor substrate 21 in the starting form that is doped p+-type and has a layer of epitaxial silicon grown 22 on the top surface that is doped p-type.

A layer of silicon dioxide ($SiO_2$) 23 is then grown or deposited on the top surface of the substrate 21 as shown in FIG. 1b. This layer of silicon dioxide 23 will act as the gate oxide of the transistors being fabricated. Subsequently, a layer of silicon nitride ($Si_3N_4$) 24 is deposited on the top surface of the silicon dioxide layer 23 on the substrate 21 as shown in FIG. 1b.

As shown in FIG. 1c, the substrate 21 then has photolithography and etching performed on the surface of the substrate 21 to form trenches 19 where the silicon nitride 24, silicon dioxide 23, and some of the p-type epitaxial silicon 22 is removed by etching. As shown, other regions 18 of the silicon nitride 24, silicon dioxide 23, and p-type epitaxial silicon 22 are not etched and are left intact. This etch forms trenches 19 to insulate the transistor devices from one another. The mask used for this patterning and etch is the inverse of the active area mask.

Next, as shown in FIG. 1d the trenches 19 are filled with a deposited silicon dioxide 25 and subsequently the top surface of the substrate 21 is planarized using chemical-mechanical polishing (CMP). The silicon nitride layer 24 is then removed.

As shown in FIG. 1e, a photolithography is performed opening regions in the photoresist 26 where an ion implantation 27 is performed of an n-type dopant into the silicon epitaxial layer 22 to form an n-type silicon region 28. This ion implantation 27 is done through the silicon dioxide layer 23. The photoresist 26 acts as a mask to the ion implantation 27 preventing the doping ions from reaching the regions covered by photoresist 26. After the ion implantation 27, the photoresist 26 is removed. The n-type silicon region 28 formed in this part of the fabrication process 20 is called the n-well 28 of the CMOS devices. Additionally, a threshold adjustment ion implantation (not shown) may also be performed prior to removing the photoresist layer 26

This sequence is repeated as shown in FIG. 1f, wherein photolithography is performed opening regions in the photoresist 29 where an ion implantation 30 is performed of a p-type dopant into the silicon epitaxial layer 22 to form a p-type silicon region 31. This ion implantation 30 is done through the silicon dioxide layer 23. The photoresist 29 acts as a mask to the ion implantation 30 preventing the doping ions from reaching the regions covered by photoresist 29. After the ion implantation 30, the photoresist 29 is removed. The p-type silicon region 31 formed in this part of the fabrication process 20 is called the p-well 31 of the CMOS devices. Additionally, a threshold adjustment ion implantation (not shown) may also be performed prior to removing the photoresist layer 29. One or more thermal anneals are performed to activate the dopants.

Next, the top surface of the substrate 21 has a layer of polycrystalline silicon or polysilicon 32 deposited and this layer has photolithography and etching performed on it to form the gates 32 of the transistors on top of the silicon dioxide layer 12 that acts as the gate oxide or gage dielectric as shown in FIG. 1g.

Next, as shown in FIG. 1h a series of photolithographic steps and ion implants are performed to dope the gate polysilicon 32 and also form the source and drains 33 of the NMOS transistors and the source and drains 34 of the PMOS and 34 of the PMOS transistors, respectively. One or more thermal anneals are performed to activate the dopants.

A layer of silicon dioxide 35 is deposited on the surface of the substrate 21 as shown in FIG. 1i.

Subsequently, this silicon dioxide layer 35 has photolithography and etching performed on the silicon dioxide layer 35 to open up regions in the silicon dioxide layer 35 to expose the source and drains 33 and 34 of the transistors as shown in FIG. 1j. This etch is called the contact hole etch.

As shown in FIG. 1k, a layer of aluminum 36 is deposited on the surface of the substrate 21.

Subsequently, this layer of aluminum 36 is subsequently patterned using photolithography and then etched into the aluminum pattern 36 which is the first metal layer 36 of the CMOS microelectronics process as shown in FIG. 1l.

As shown in FIG. 1m, the substrate 21 then has a layer of silicon dioxide 37 deposited and then photolithography and etching are performed on this layer of silicon dioxide 37 as shown. Lastly, also as shown in FIG. 1m, a layer of aluminum is deposited 38 and this layer of aluminum 38 then has photolithography and etching performed on it into the aluminum pattern 38 which is the second metal layer of the CMOS microelectronics process.

Depending on the type of CMOS process, there may be more than two (2) dielectric and metal layers in the electrical interconnection wiring. Some advanced microelectronics processes have more than ten (10) metal layers.

Figure 2:
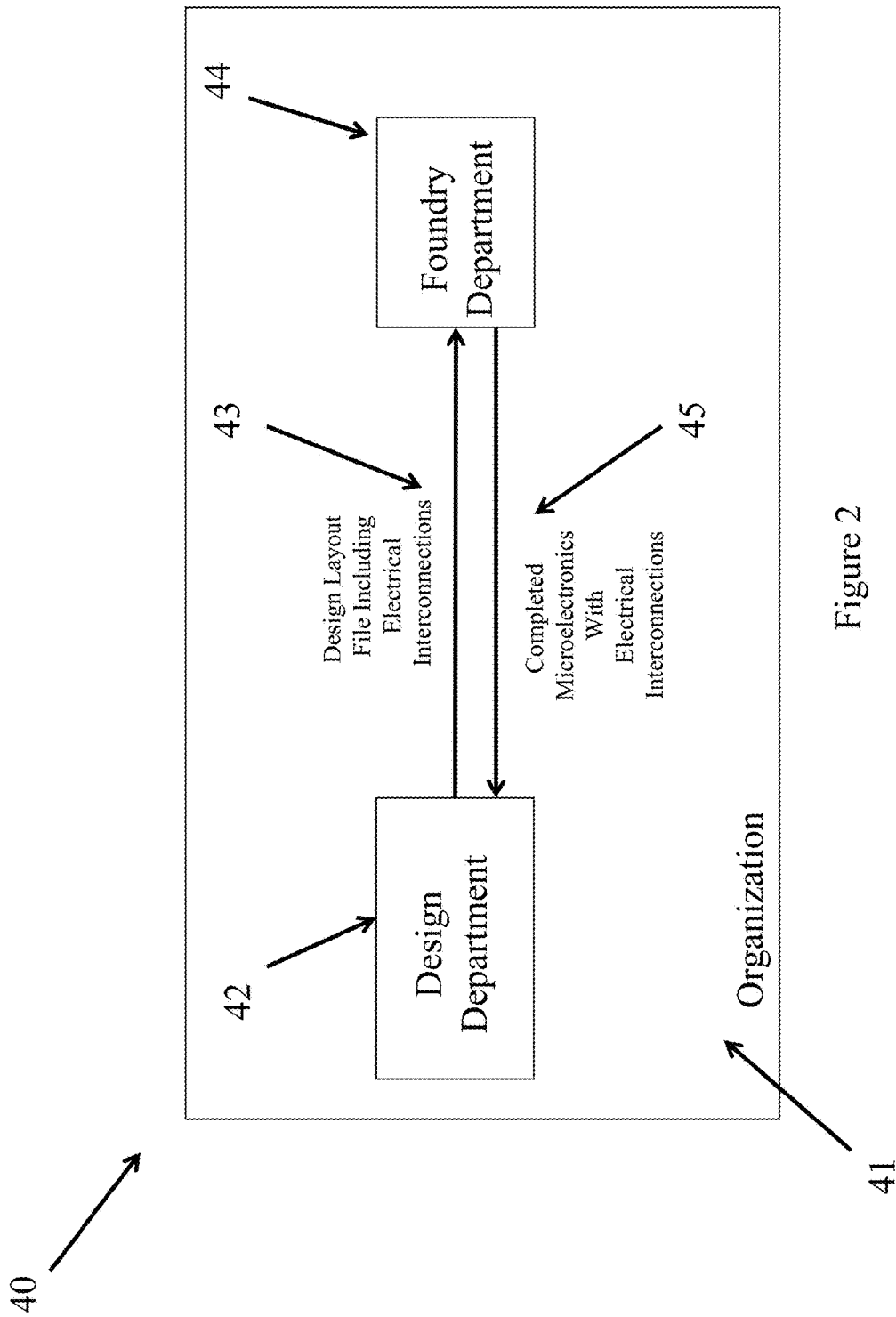
FIG. 2 is an illustration of an organization whereby the design and manufacturing are performed inside the same organization.

FIG. 2 illustrates how the manufacturing 40 of microelectronics, such as the CMOS process flow shown in FIGS. 1a to 1m, was previously performed by organizations. This scenario would be the case in the early years of the microelectronics industry, specifically from about the late 1960's to the 1990's. As illustrated in this scenario 40, the organization 41, which could be a company, educational institution or Government entity, that performs the design of the microelectronics, also performs the manufacturing. The design department 42 within the organization 41 creates the design layout file 43 of the microelectronics integrated circuits that is sent to the foundry department 44. The foundry department 44 performs the manufacturing of the microelectronics according to the design submitted by the design department 42 and once the manufacturing is completed, the completed microelectronics 45 are sent from the foundry department 44 to the design department 42. Importantly, the entire design and manufacturing of the microelectronics takes place inside the same organization 41. Therefore, there is little to no risk of the design layout 43 created by the design department 42 from being stolen or misused by the foundry department 44 or any other entity since the entire design and manufacturing process is performed inside the same organization 41.

The scenario of FIG. 2 was often the practice of manufacturing microelectronics in the past, but is no longer the typical scenario. The enormously increasing costs of foundry operations, coupled with the enormous volumes of substrates and die that can be produced in a single foundry, and also coupled with the limited production needs of all but the world's largest microelectronics companies, has resulted in an industry whereby most organizations and companies that design and sell microelectronics do not manufacture the microelectronics themselves. Instead, these companies send their designs to another company that is a "pure-play" foundry that manufactures the microelectronics for the design company based on the design company's designs and sends the microelectronics back to the design company when the manufacturing has been completed.

Figure 3:
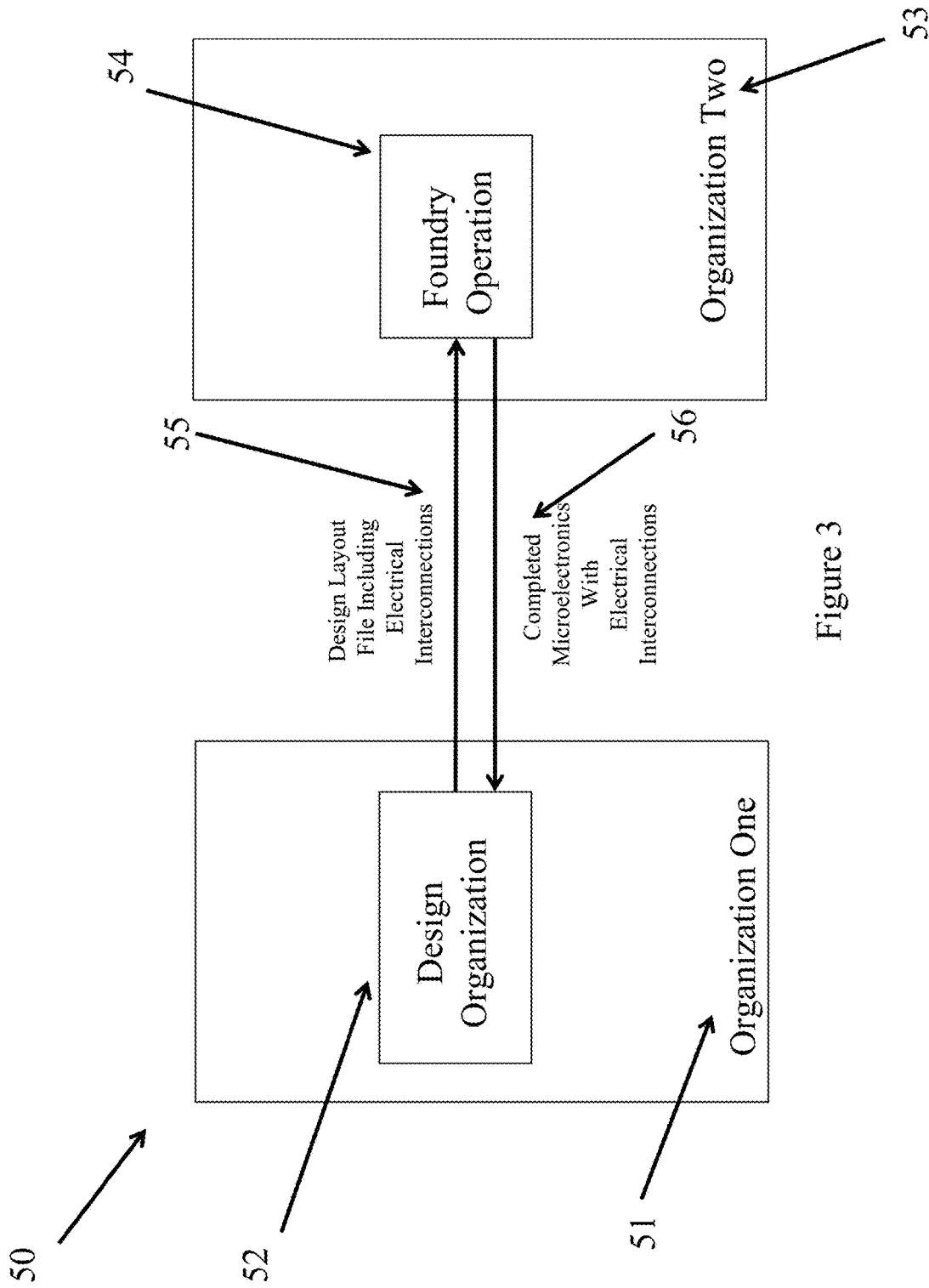
FIG. 3 is an illustration of two organizations whereby the design of microelectronics is performed in one organization and the manufacturing of the microelectronics is performed in another organization.

The scenario 50 of "out-sourcing" the manufacturing of microelectronics is illustrated in FIG. 3. Organization One 51, which can be a company, an academic institution, or a Government entity, develops the design layout 55 of a microelectronics and this is usually done by the design organization 52 within organization One 51. The design organization 52 within organization one 51 submits the design layout including electrical interconnection layers 55 to the foundry operation 54 within organization two 53. The foundry operation 54 within organization two 53 manufactures the microelectronics 56 according to the design layout 55 submitted by the design organization 52 within organization one 51. Once the microelectronics manufacturing is completed, the microelectronics 56 are sent by organization two 53 to organization one 51.

The current practice of the pure-play foundry business, illustrated by organization two 53 in FIG. 3, is to perform microelectronics manufacturing for a number of other businesses, one of which is represented by organization one 51 in FIG. 3. This allows the pure-play foundry 53, represented by organization two 53 in FIG. 3, to fill the capacity of the foundry operation 54, which typically would not be possible if organization two 53 limited its manufacturing to only one customer, represented by organization one 51 in FIG. 3. Instead, organization two 53 typically will provide manufacturing services to as many customers, represented by organization one 51 in FIG. 3, as possible.

Figure 4:
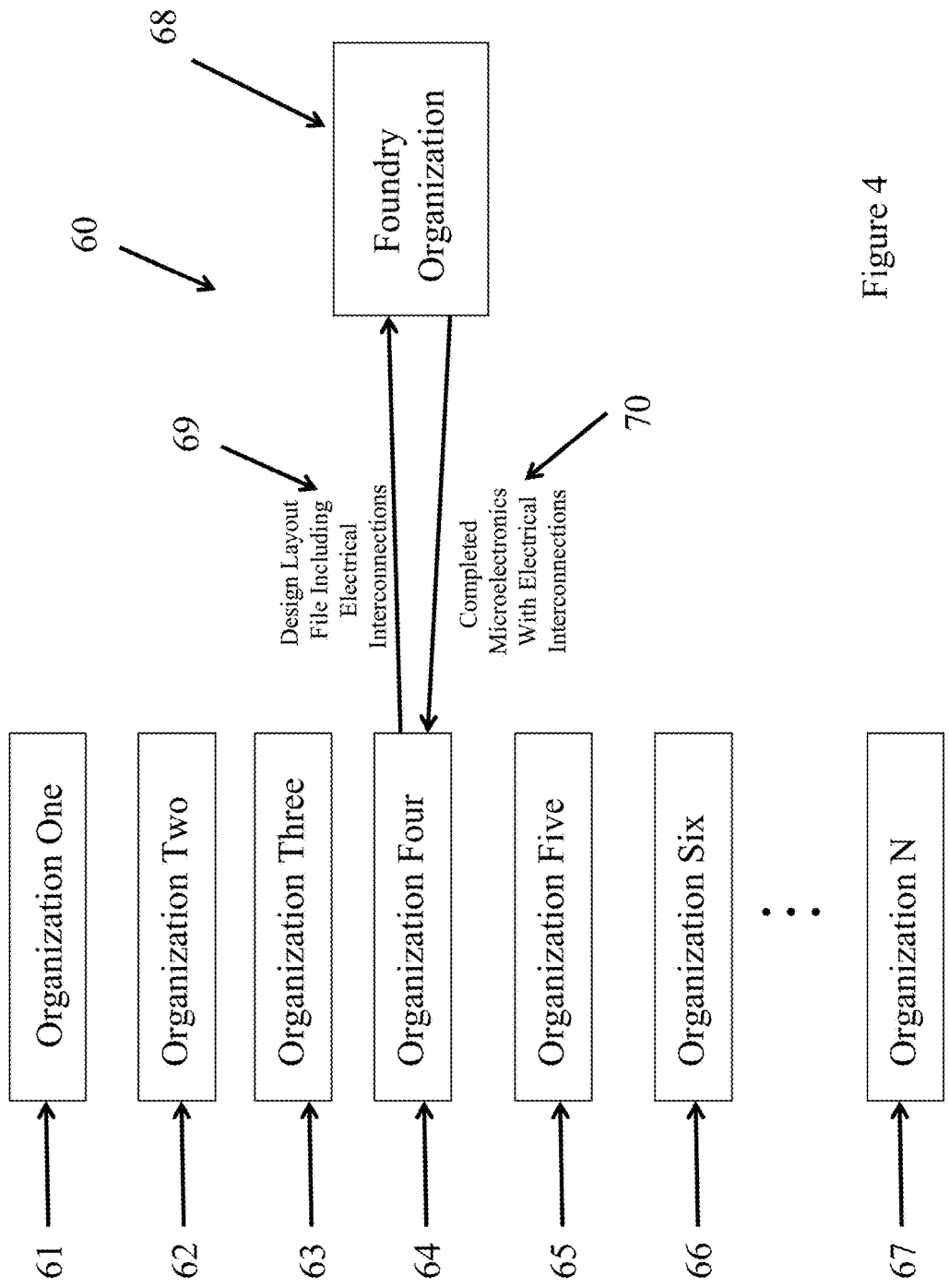
FIG. 4 is an illustration of a number of organizations each of which is performing the design of microelectronics and each sends their designs to a foundry that performs the manufacturing of the microelectronics.

This is illustrated in FIG. 4, which shows a number of organizations 60 and their relationships. The organizations that create the design of their microelectronics are labeled organization one 61, organization two 62, organization three 63, organization four 64, organization five 65, organization six 66, all the way to organization N 67, where N is the total number of customer organizations creating design layouts including electrical interconnection layers 69 and using the microelectronics manufacturing services of the foundry organization 68. Once the foundry organization 68 has completed the manufacturing, the completed microelectronics with electrical interconnections 70 are sent back to the respective design organization one 61, organization two 62, organization three 63, etc. that submitted the design 69.

While the scenario shown in FIGS. 3 and 4 are common practice in the microelectronics industry and is a lower cost approach for organizations and companies needing microelectronics manufacturing for their businesses, it requires the organizations creating the design to share their designs, that is, their valuable and proprietary intellectual property, with the foundry organization 68, which is another organization or company. Further, the foundry organization 68 may be located anywhere in the country and under any ownership.

Consequently, the organization one 51 that sends their designs 55 to organization two 53 having a manufacturing foundry operation 54 must place a great amount of trust in the manufacturing foundry 54 since the design layouts 55 often consist of proprietary and/or confidential designs that represent very valuable intellectual property of organization one 51. Moreover, in some circumstances the design layouts 55 may also contain information that is controlled by export regulations that precludes sending the designs out of the country without getting Governmental approval as well as taking numerous precautions. In still other circumstances the designs may also contain information that is covered under other laws.

The tremendous complexity of state-of-the-art microelectronics makes knowing if a design has been misused extremely difficult to detect or police. Also, the enormous complexity of state-of-the-art microelectronics technologies also makes it very difficult to determine if something nefarious has been done to the devices and/or systems during manufacturing that could cause the microelectronics to function improperly some time in the future after it is integrated into an expensive system.

The present invention describes a method for the manufacturing of integrated circuits, microelectronics, microelectro-mechanical systems (MEMS), nano-electro-mechanical systems (NEMS), photonics, and any micro- and nano-fabricated devices and systems fabricated using micro- and nano-fabrication methods that are sent to another party for manufacturing and still maintain confidentiality of the design. This invention is illustrated in FIG. 5.

Figure 5:
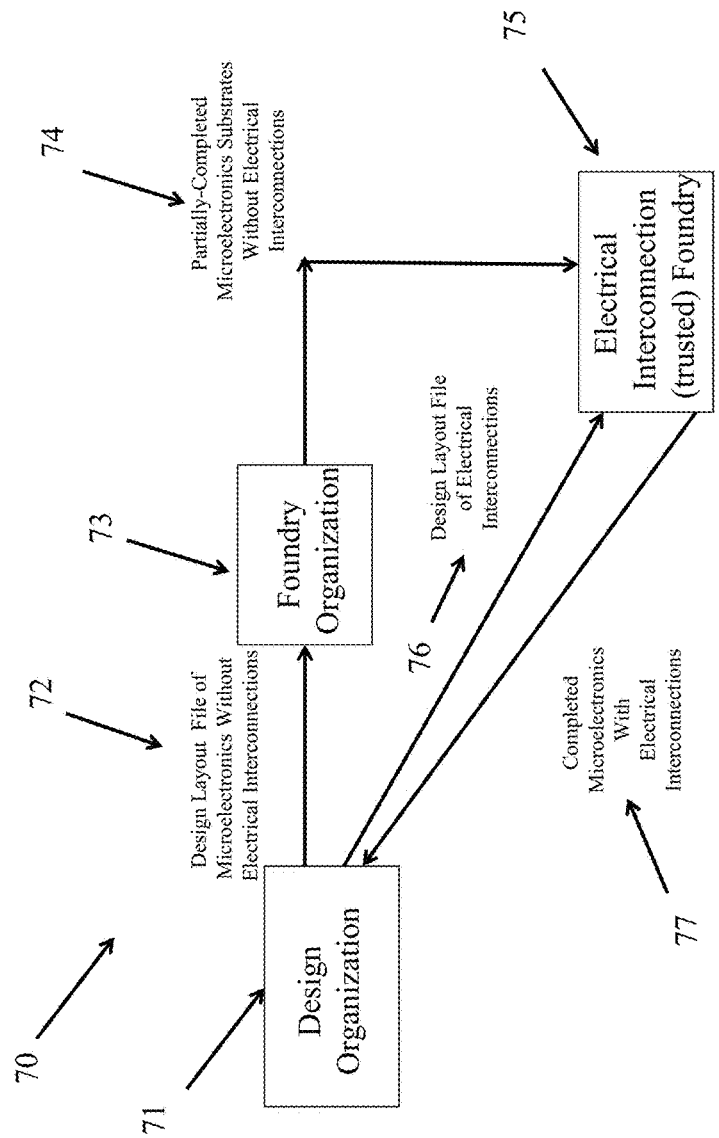
FIG. 5 is an illustration of the present invention whereby the design organization only sends a portion of the design to one organization which performs only part of the manufacturing of the microelectronics and the completion of the microelectronics manufacturing is performed by a trusted foundry.

FIG. 5 illustrates the method of the present invention in a chart 70. The organizations involved in the design and manufacturing include: the design organization 71; the foundry organization 73; and the electrical interconnection foundry 75. The design organization 71 generates a design layout file 72 that adheres to the design rules of the foundry operation 73. This design layout file 72 includes all the masking layers involved in the manufacturing of the devices and systems except the masking layers involved in making the electrical interconnection layers. The foundry operation 73 can be located anywhere in the world and takes the design layout file without the electrical interconnections 72 and manufactures a number of substrates ordered by the design organization 71 according to the design layout file 72 submitted by the design organization 71. Importantly, the manufacturing performed by the foundry organization 73 includes all of the steps in making the devices and systems except the electrical interconnection layers. In fact, the foundry organization 73 is not privy to the design of the electrical interconnections 76. On completion of the manufacturing by the foundry organization 73, the substrates without the electrical interconnections 74 are sent to the electrical interconnection foundry 75. The design organization 71 also sends to the electrical interconnection foundry 75 an electrical interconnection design layout file 76 suitable for the manufacturing of the electrical interconnects on the substrates made by the foundry organization 73. The electrical interconnection foundry 15 performs the manufacturing of the electrical interconnections on the substrates according to the electrical interconnection design layout file 76 submitted by the design organization 71. On completion of the manufacturing of the electrical interconnection on the substrates by the electrical interconnection foundry 75, as well as any other manufacturing steps that are required during or after the manufacturing of the electrical interconnections to complete the manufacturing of the devices and systems, the completed substrates with the electrical interconnections 77 are sent to the design organization 71.

It is important to point out that the flow chart 70 of FIG. 5 is illustrative of the general concept of the present invention and there may be variations in the method that are covered by this invention. Specifically, the design organization 71 may be the same organization as the electrical interconnection foundry 75. Additionally, the foundry organization 73 may perform fabrication of some of the electrical interconnection layers required to implement the device and systems, but not all of them. Also, the foundry organization 73 may not perform all of the manufacturing steps prior to the electrical connection fabrication before the substrates are sent to the electrical interconnection foundry 75. Lastly, the electrical interconnection foundry 75 may perform more manufacturing steps than just the electrical interconnection manufacturing steps. The important concept of the present invention is that steps that are to be kept private, secret, secure, and/or confidential from the foundry operation 73 are performed by the electrical interconnection foundry 75 and/or the design organization 71.

How the present invention is conducted is illustrated by FIGS. 1a to 1m, which as described above is a series of cross sections of a substrate as it proceeds through the manufacturing process steps to fabricate CMOS microelectronics.

Under the present invention, the substrate would be partially manufactured in the foundry organization 73 that was owned and/or operated by another organization or company up to the silicon dioxide 35 deposition in FIG. 1i. This would include the foundry operation 73 performing all of the manufacturing steps in the fabrication of the semiconductor substrates for the making of the CMOS microelectronics up to and including the deposition, patterning and etching of the gate electrode layer 32 (polysilicon) and the deposition of the silicon dioxide layer 35 on top of the polysilicon gate electrode layer 32.

Subsequently, at this point the partially manufactured substrates are then sent to an electrical interconnection foundry 75 (that may be the same organization as the design organization 71 or a separate business and legal entity) where the remaining steps to fabricate the electrical interconnection layers illustrated by FIGS. 1j through 1m are completed. Importantly, the foundry organization 73 is not provided and is not privy to the design layout of the electrical interconnections and therefore cannot determine the use or functionality of the microelectronics design.

Typically, the design organization 71 creates a design of the microelectronics using electronic design automation (EDA) design tools. Typically, the design 72 created by the design organization 71 adheres to the design rules of the foundry operation 73. These design rules include minimum feature sizes, minimum overlaps, etc. After creating the design layout 72, the design organization 71 sends the design layout 72 to the foundry operation 73 for manufacturing. The design layout file 72 does not include the electrical interconnection wiring diagrams to connect the microelectronics devices into a desired circuit design. The foundry operation 73 manufactures some number of die and/or substrates using the manufacturing process that is selected by the design organization 71. Note that a foundry operation 73 may have one or more microelectronics manufacturing processes made available to design organizations 71. The foundry operation 73 performs all of the manufacturing steps required to complete the entire microelectronics integrated circuits 74 except all of the electrical interconnections; that is, the foundry operation 73 performs the manufacturing of everything except all of the metal interconnections layers.

Importantly, the manufacturing configuration 73 shown in FIG. 5 often involves a design organization 71 that is a physically and legally separate and distinct business or operation from the foundry operation 73. Moreover, the design organization 71 and the foundry operation 73 may be located anywhere in the world and each may be located in separate countries. Typically, in modern microelectronics manufacturing the foundry operation 73 would be located in Asia and the design organization 71 is located in the Americas, Europe, the Middle East, Asia, or Oceania.

It is important to note that the manufacturing example of FIGS. 1a to 1m of CMOS microelectronics is only illustrative of one embodiment of the present invention. Specifically, the manufacturing process performed by the foundry organization 73 may involve a scenario where the foundry operation 73 terminates the manufacturing of the substrates prior to the gate electrode 32 being made. That is, the electrical interconnection foundry 75 may perform all of the manufacturing steps up to but not including the fabrication of the gate electrodes 32 illustrated in FIG. 1g.

Another embodiment of the present invention would involve the deposition of the gate electrode layer, and then sending the partially manufactured substrates to the electrical interconnection foundry 75 who then performs the patterning and etching of the gate electrodes 32 and all other manufacturing steps involved in the fabrication of the microelectronics.

Yet another embodiment of the present invention involves having the fabrication of the second, third, fourth or later electrical interconnection performed by the interconnection foundry 75 after the fabrication of the partially manufactured microelectronics was performed by the foundry organization 73.

Another embodiment of the present invention is particularly well suited to a type of integrated circuit called a field-programmable gate array (FPGA), which is an integrated circuit designed to be configured by a customer or designer after the manufacturing of the integrated circuit has been completed. FPGAs are essentially generic integrated circuits whereby the customer can configure the FPGA to perform functionality specific to the customer's needs. FPGAs have taken over much of the business for applications that used application-specific integrated circuits (ASICs) since FPGAs have lower non-recurring engineering costs than ASICs.

Some FPGAs have analog features in addition to digital functions. Some FPGAs also have "mixed signal" capability; that is, both digital and analog integrated circuit functionality, while still others are very complex systems that are termed "systems-on-a-chip." Another variation is field-programmable analog arrays (FPAAs) which processes analog signals on an internally programmable interconnection fabric.

The present invention is also well suited for ASICs whereby the integrated circuit is made up to the point of the electrical interconnection layers and the electrical interconnection layers are made by a trusted electrical interconnection foundry 75.

In another embodiment, any type of micro- or nano-fabricated device and/or system, including any type of microelectronics, integrated circuits, MEMS, NEMS, photonics, etc. is made using the present invention whereby the manufacturing is performed by a foundry organization 73 up to a critical point of the manufacturing process before any proprietary, confidential, secret, or private design information is required in order to complete the manufacturing, at which point the partially manufactured devices and/or systems are sent to another trusted foundry 75 for the completion of the manufacturing. The completed devices and/or systems are then sent back to the design organization 71.

Figure 6:
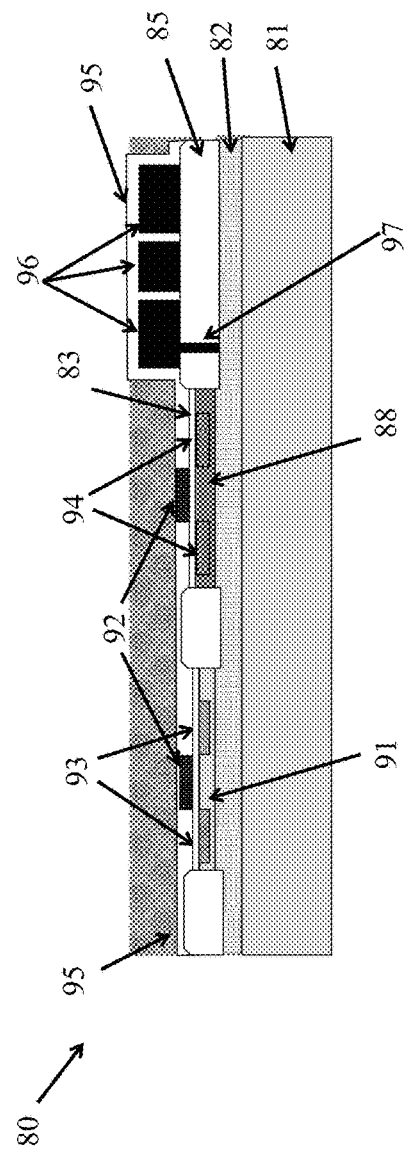
FIGS. 6a and 6b are an illustration of one embodiment of the method of the present invention in the manufacturing of a MEMS and microelectronics system.
Figure 6:
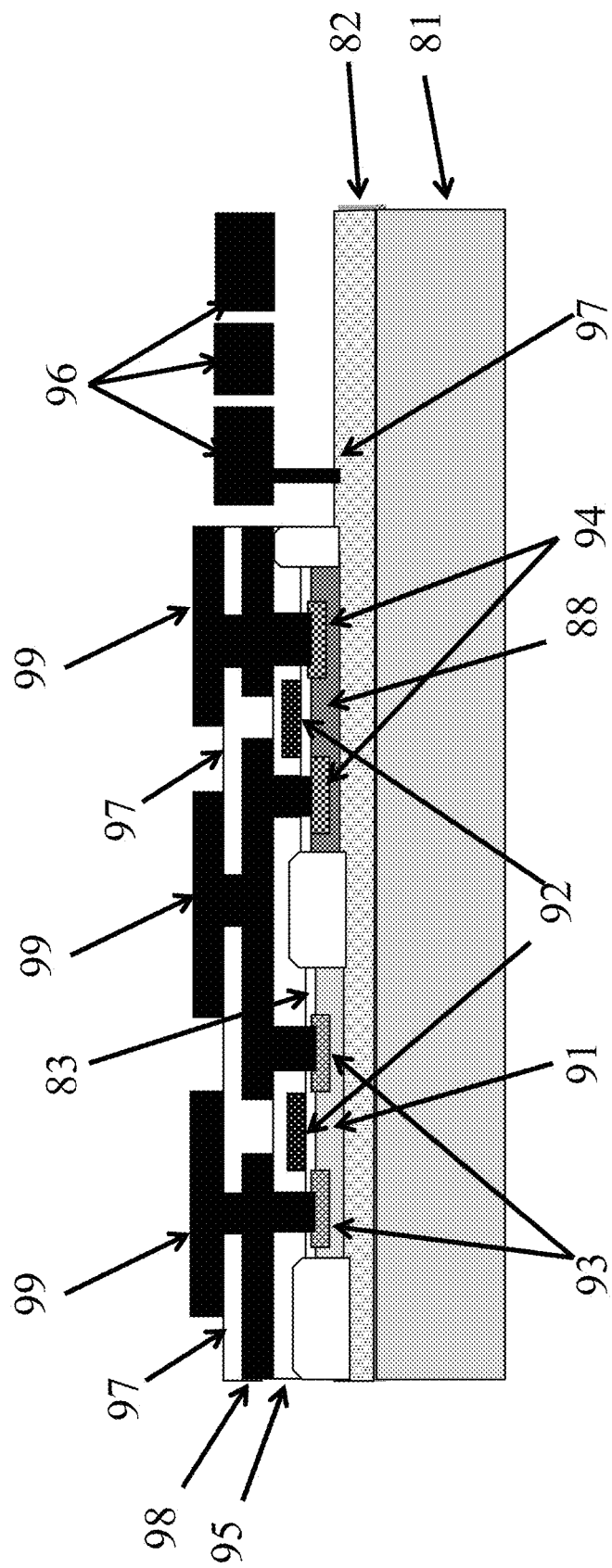

An embodiment of the method of the present invention in the manufacturing of a MEMS and microelectronics system is illustrated in FIGS. 6a and 6b. The substrate 81 proceeds through the fabrication steps for making CMOS as described in FIG. 1a through 1i, except some additional steps to form a MEMS component 96 as shown in FIG. 6a. To fabricate this MEMS device 96, the silicon dioxide layer 85 has photolithography and etching performed on this layer 85 to form a through layer via 97, which is then filled with a conductive material layer 97. A conductive layer of material 96 is deposited and photolithography and etching are performed on this layer 96 to pattern it into the desired shape of the MEMS device 96. A layer of silicon dioxide 95 is then deposited over the surface of the substrate 81.

At this point in the fabrication, the substrate 81 is sent to an electrical interconnection foundry which performs the fabrication steps to complete the manufacturing of the integrated MEMS and microelectronics system 80 as shown in FIG. 6b. These include deposition, patterning and etching of subsequent layers of silicon dioxide 97 and metal electrical interconnection layers 98 and 99. At the completion of the fabrication, the silicon dioxide layer 85 is removed which acted as a sacrificial layer thereby releasing the MEMS device 96 to move.

It is understood that the embodiments described of the present invention are only some of the embodiments of the present invention and any method whereby a portion of the manufacturing is performed at a trusted or in-house foundry would be covered by this invention.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of manufacturing a device, a system or the device and the system using microfabrication or nanofabrication technologies, the method comprising:
    having a first organization design the device and/or system to be manufactured, the design of the device and/or system to be manufactured including design layout artwork and fabrication steps for making the device and/or system;
    dividing the fabrication steps for making the device and/or system to be manufactured into a first part in which the fabrication of the device and/or system is performed, minus the fabrication of electrical interconnections to complete the manufacturing of the device and/or system, and a second parts in which the fabrication of the electrical interconnections to complete the manufacturing of the device and/or system is performed;
    sending the first part of the fabrication steps for making the device and/or system to be manufactured to a second organization which operates a first manufacturing foundry;
    having the second organization perform the first part of the fabrication steps to thereby partially manufacture the device and/or system to be manufactured;
    sending the second part of the fabrication steps for making the device and/or system to be manufactured and the partially manufactured device and/or system to a third organization which operates a second manufacturing foundry;
    having the third organization perform on the partially manufactured device and/or system the second part of the fabrication steps for making the device and/or system to be manufactured to complete the manufacturing of the device and/or system.

2. The method of claim 1, wherein the device and/or system is/are one or more of the following technologies, including: integrated circuits; microelectronics; micro-electro-mechanical systems (MEMS); nano-electro-mechanical systems (NEMS); photonics; or any micro- and nano-fabricated devices and systems fabricated using micro- and nano-fabrication methods.

3. The method of claim 1, wherein the design layout artwork for of the device and/or system to be manufactured is a design layout file that includes one or more designs of photolithography masks used in the manufacturing of the device and/or system to be manufactured.

4. The method of claim 1, wherein the second organization is a semiconductor foundry that performs the fabrication steps other than for fabricating the electrical interconnection layers.

5. The method of claim 1, wherein the third organization is a semiconductor foundry that performs the fabrication steps for fabricating the electrical interconnection layers.

6. The method of claim 1, wherein the first organization is a business and legal entity which is separate from the second organization.

7. The method of claim 1, wherein the first organization is a business and legal entity which is separate from the second and third organizations.

8. The method of claim 1, wherein the first organization is a business and legal entity, and wherein the third organization is a part of the first organization.

9. The method of claim 1, wherein the devices manufactured by the second and third organizations are field-programmable gate arrays (FPGAs).

10. The method of claim 1, wherein the devices manufactured by the second and third organizations are field-programmable analog arrays (FPAAs).

11. The method of claim 1, wherein the devices manufactured by the second and third organizations are application-specific integrated circuits (ASICs).

12. A method of manufacturing of a device, a system or the device and the system comprised of integrated circuits; microelectronics; micro-electro-mechanical systems (MEMS); nano-electro-mechanical systems (NEMS); photonics; or any micro- and nano-fabricated device and/or system that is/are fabricated using micro- and nano-fabrication technologies, the method comprising:
  having a first organization design the device and/or system to be manufactured, the design of the device and/or system to be manufactured including design layout artwork and fabrication steps for making the device and/or system;
  dividing the fabrication steps for making the device and/or system to be manufactured into a first part in which the fabrication of the device and/or system is performed, minus the fabrication of electrical interconnections to complete the manufacturing of the device and/or system, and a second part in which the fabrication of the electrical interconnections to complete the manufacturing of the device and/or system is performed;
  sending the first part of the fabrication steps for making the device and/or system to be manufactured to a second organization which operates a first manufacturing foundry;
  having the second organization perform the first part of the fabrication steps to thereby partially manufacture the device and/or system to be manufactured;
  sending the second part of the process sequence portion of the design of the device and/or system to be manufactured to a third organization which operates a second manufacturing foundry;
  having the third organization manufacture the second part of the process sequence portion of the design of the device and/or system to be manufactured to complete the manufacturing method.

13. A method for the secure and confidential manufacturing of a device, a system or the device and the system comprised of integrated circuits; microelectronics; micro-electro-mechanical systems (MEMS); nano-electro-mechanical systems (NEMS); photonics; or any micro- and nano-fabricated devices and systems that are fabricated using micro- and nano-fabrication technologies, the method comprising:
  having a design organization design the device and/or system to be manufactured, the design of the device and/or system to be manufactured including design layout artwork and fabrication steps for making the device and/or system;
  dividing the fabrication steps for making the device and/or system to be manufactured into a first part in which the fabrication of the device and/or system is performed, minus the fabrication of electrical interconnections to complete the manufacturing of the device and/or system, and a second part in which the fabrication of the electrical interconnections to complete the manufacturing of the device and/or system is performed;
  sending the first part of the fabrication steps for making the device and/or system to be manufactured to an untrusted foundry organization;
  having the untrusted foundry organization perform the first part of the fabrication steps so as to partially produce the device and/or system to be manufactured;
  sending the partially produced device and/or system to be manufactured and the second part of the fabrication steps for making the device and/or system to be manufactured to a trusted foundry organization;
  having the trusted foundry organization complete the partially produced device and/or system to be manufactured by performing the second part of the fabrication steps for making the device and/or system to be manufactured to securely and confidentially complete the manufacturing method.

14. A method for the secure and confidential manufacturing of a device, a system or the device and the system comprised of integrated circuits; microelectronics; micro-electro-mechanical systems (MEMS); nano-electro-mechanical systems (NEMS); photonics; or any micro- and nano-fabricated devices and systems that are fabricated using micro- and nano-fabrication technologies, the method comprising:
  having a design organization design the device and/or system to be manufactured, the design of the device and/or system to be manufactured including design layout artwork and fabrication steps for making the device and/or system;
  dividing the fabrication steps for making the device and/or system to be manufactured into a plurality of parts including the fabrication of the device and/or system is performed, minus the fabrication of electrical interconnections to complete the manufacturing of the device and/or system, and the separate fabrication of the electrical interconnections to complete the manufacturing of the device and/or system is performed;
  sending one or more parts of the fabrication steps for making the device and/or system to be manufactured to one or more untrusted foundry organizations;
  having the one or more untrusted foundry organizations perform the one or more parts of the fabrication steps, minus the fabrication of electrical interconnections to complete the manufacturing of the device and/or system, so as to partially produce the device and/or system to be manufactured;
  sending the partially produced device and/or system to be manufactured and a final part of the fabrication steps for making the device and/or system to be manufactured to a trusted foundry organization;
  having the trusted foundry organization complete the partially produced device and/or system to be manufactured by performing the final part of the fabrication steps for fabricating the electrical interconnections to complete the making of the device and/or system to be manufactured to thereby securely and confidentially complete the manufacturing of the device and/or system.

15. A method of manufacturing of a device, a system or the device and the system using micro- and nano-fabrication technologies, the method comprising:

having a design organization design the device and/or system to be manufactured, the design of the device and/or system to be manufactured including design layout artwork and fabrication steps for making the device and/or system;

dividing the fabrication steps for making the device and/or system to be manufactured into a plurality of parts including the fabrication of the device and/or system is performed, minus the fabrication of electrical interconnections to complete the manufacturing of the device and/or system, and the separate fabrication of the electrical interconnections to complete the manufacturing of the device and/or system is performed;

sending one or more parts of the fabrication steps for making the device and/or system to be manufactured to one or more first kind of foundry organizations;

having the one or more first kind of foundry organizations perform the one or more parts of the fabrication steps for making the devices or systems, minus the fabrication of electrical interconnections to complete the manufacturing of the device and/or system, so as to partially produce the device and/or system to be manufactured;

sending the partially produced device and/or system to be manufactured and one or more additional parts of the fabrication steps for making the device and/or system to be manufactured to one or more second kind of foundry organizations;

having one or more second kind of foundry organizations complete the partially produced device and/or system to be manufactured by performing the one or more additional parts of the fabrication steps for fabricating the electrical interconnections to complete the making of the device and/or system to be manufactured to thereby complete the manufacturing of the device and/or system.

16. The method of claim 15, wherein the one or more first kind of foundry organizations are untrusted foundry organizations, and wherein the one or more second kind of foundry organizations are trusted foundry organizations.

* * * * *